(12) United States Patent
Isogai et al.

(10) Patent No.: US 7,977,219 B2
(45) Date of Patent: Jul. 12, 2011

(54) MANUFACTURING METHOD FOR SILICON WAFER

(75) Inventors: Hiromichi Isogai, Niigata (JP); Takeshi Senda, Niigata (JP); Eiji Toyoda, Niigata (JP); Kumiko Murayama, Niigata (JP); Koji Izunome, Niigata (JP); Susumu Maeda, Kanagawa (JP); Kazuhiko Kashima, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 151 days.

(21) Appl. No.: 12/512,229

(22) Filed: Jul. 30, 2009

(65) Prior Publication Data
US 2010/0055884 A1 Mar. 4, 2010

(30) Foreign Application Priority Data

Jul. 31, 2008 (JP) ................ P. 2008-198682

(51) Int. Cl.
*H01L 21/20* (2006.01)
(52) U.S. Cl. ................ 438/502; 257/E21.114
(58) Field of Classification Search ............ 438/493, 438/497, 500, 502; 257/E21.114
See application file for complete search history.

(56) References Cited

U.S. PATENT DOCUMENTS

| 6,129,787 | A | 10/2000 | Adachi et al. |
| 6,191,010 | B1 * | 2/2001 | Falster .......... 438/471 |
| 6,492,682 | B1 | 12/2002 | Akiyama et al. |
| 6,897,084 | B2 * | 5/2005 | Binns et al. ....... 438/58 |

FOREIGN PATENT DOCUMENTS

| JP | 11-260677 A | 9/1999 |
| JP | 2001-144275 A | 5/2001 |
| JP | 2002-299344 A | 10/2002 |
| JP | 2003-115491 A | 4/2003 |
| KR | 10-0685260 B1 | 2/2007 |

* cited by examiner

*Primary Examiner* — Chandra Chaudhari
(74) *Attorney, Agent, or Firm* — Foley & Lardner LLP

(57) ABSTRACT

In a manufacturing method for a silicon wafer, a first heat treatment process is performed on the silicon wafer while introducing a first gas having an oxygen gas in an amount of 0.01 vol. % or more and 1.00 vol. % or less and a rare gas, and a second heat treatment process is performed while stopping introducing the first gas and introducing a second gas having an oxygen gas in an amount of 20 vol. % or more and 100 vol. % or less and a rare gas. In the first heat treatment process, the silicon wafer is rapidly heated to first temperature of 1300° C. or higher and a melting point of silicon or lower at a first heating rate, and kept at the first temperature. In the second heat treatment process, the silicon wafer is kept at the first temperature, and rapidly cooled from the first temperature at a first cooling rate.

5 Claims, 5 Drawing Sheets

DURING FIRST HEAT TREATMENT PROCESS

INNER-WALL OXIDE FILM

DURING SECOND HEAT TREATMENT PROCESS

COMPLETION OF RTP

TIME (sec)

MANUFACTURING METHOD FOR SILICON WAFER

BACKGROUND OF THE INVENTION

1. Field of the Invention

The present invention relates to a manufacturing method for a silicon wafer to be used as a substrate of semiconductor devices.

2. Description of Related Art

With trends toward high integration of semiconductor devices in recent years, requirement for quality of a silicon wafer to be used as a substrate of such semiconductor devices is becoming severer. In particular, there is an eager demand for the development of a silicon wafer having less grown-in defects in the device active region.

A technique of performing heat treatment on a silicon wafer is well known as a process for reducing such grown-in defects.

As one example of such a technique, there is a technique of heat treating a silicon wafer at a temperature of 1000° C. or higher and 1350° C. or lower for 50 hours or less in a hydrogen and/or inert gas atmosphere, followed by oxidation heat treatment at a temperature range of 800° C. or higher and 1350° C. or lower for 50 hours or less (for example, Japanese Patent Unexamined Publication JP-A-11-260677).

There is also known a technique of heat treating a silicon single crystal wafer at a temperature of from 1100 to 1300° C. in a non-oxidizing atmosphere for 1 minute or more and heat treating the resulting wafer continuously at a temperature of from 700 to 1300° C. in an oxidizing atmosphere for 1 minute or more without cooling it to a temperature less than 700° C., thereby forming a silicon oxide film on the surface of the wafer (for example, Japanese Patent Unexamined Publication JP-A-2001-144275).

In recent years, a technique for subjecting a silicon wafer to rapid heating/cooling thermal process (RTP: Rapid Thermal Process) is known as a technique of producing, in a high productivity and an easy manner, a silicon wafer with few defects in the surface layer of the wafer.

As one example, there is known a technique of heating a material for substrate obtained from a silicon single crystal having an oxygen concentration of from 11 to $17 \times 10^{17}$ atoms/cm$^3$ (ASTM F-121, 1979) at from 1100 to 1280° C. for from 0 to 600 seconds in an atmosphere containing nitrogen in an amount of 90% or more and then cooling it at a cooling rate of from 100 to 25° C./sec in an atmosphere switched to that containing oxygen in an amount of 10% or more (for example, Japanese Patent Unexamined Publication JP-A-2003-115491).

The heat treatment technique described in the JP-A-11-260677 is however not preferred because it has poor productivity because long heat treatment time is necessary and in addition, slip tends to occur during heat treatment.

The heat treatment technique described in the JP-A-2001-144275 is also not preferred because it has also poor productivity due to a substantially long heat treatment time and in addition, slip tends to occur during heat treatment.

In the heat treatment technique described in the JP-A-2003-115491, a nitride film is inevitably formed on the surface of the silicon wafer as a result of heat treatment in an atmosphere containing nitrogen in an amount of 90% or more. Thus, a step for removing the nitride film, such as etching process, is required so that the number of manufacturing steps is increased. Therefore, this technique is also not preferred.

SUMMARY OF THE INVENTION

In view of the above situation, the invention has been made. An object of the invention is to provide a manufacturing method for a silicon wafer capable of reducing a grown-in defect while suppressing generation of slip during a rapid heating/cooling thermal process and in addition, capable of improving surface roughness of the silicon wafer obtained by the rapid heating/cooling thermal process.

According to an aspect of the invention, there is provided a manufacturing method for a silicon wafer including:

producing a silicon single crystal ingot grown by Czochralski process;

slicing the silicon single crystal ingot into plural silicon wafers;

performing a first heat treatment process on the silicon wafer while introducing a first gas having an oxygen gas in an amount of 0.01 vol. % or more and 1.00 vol. % or less and a rare gas, the first heat treatment process including:

rapidly heating the silicon wafer to a first temperature of 1300° C. or higher and a melting point of silicon or lower at a first heating rate; and keeping the silicon wafer at the first temperature; and after the first heat treatment process, performing a second heat treatment process on the silicon wafer while stopping introducing the first gas and instead, introducing a second gas having an oxygen gas in an amount of 20 vol. % or more and 100 vol. % or less and a rare gas, the second heat treatment process including:

keeping the silicon wafer at the first temperature; and rapidly cooling the silicon wafer from the first temperature at a first cooling rate.

It is preferred that the first heating rate is 10° C./sec or more and 150° C./sec or less and the first cooling rate is 10° C./sec or more and 150° C./sec or less.

According to another aspect of the invention, there is provided a manufacturing method for a silicon wafer including:

producing a silicon single crystal ingot grown by Czochralski process;

slicing the silicon single crystal ingot into plural silicon wafers;

performing a first heat treatment process on the silicon wafer while introducing a first gas including a rare gas, the first heat treatment including:

rapidly heating the silicon wafer to a first temperature of 1300° C. or higher and the melting point of silicon or lower at a first heating rate;

keeping the silicon wafer at the first temperature, rapidly cooling the silicon wafer to a second temperature of 800° C. or higher and 1000° C. or lower at a first cooling rate, and keeping the silicon wafer at the second temperature; and performing a second heat treatment process on the silicon wafer while stopping introducing the first gas and instead, introducing a second gas including an oxygen gas in an amount of 20 vol. % or more and 100 vol. % or less; the second heat treatment including:

keeping the silicon wafer at second temperature;

rapidly heating the silicon wafer from the second temperature to a third temperature of 1300° C. or higher and the melting point of silicon or lower at a second heating rate;

keeping the silicon wafer at the third temperature; and rapidly cooling the silicon wafer from the third temperature at a second cooling rate.

It is preferred that the first cooling rate is 20° C./sec or more and 150° C./sec or less and the second heating rate is 20° C./sec or more and 150° C./sec or less.

It is preferred that the first cooling rate is 10° C./sec or more and 150° C./sec or less and the second cooling rate is 10° C./sec or more and 150° C./sec or less.

The present invention provides a manufacturing method for a silicon wafer capable of reducing a grown-in defect while preventing generation of slip during a rapid heating/cooling thermal process and in addition improving surface roughness of the silicon wafer obtained by the rapid heating/cooling thermal process.

DETAILED DESCRIPTION OF EXEMPLARY EMBODIMENTS OF THE PRESENT INVENTION

Exemplary embodiments of the invention will hereinafter be described referring to accompanying drawings.

Figure 1:
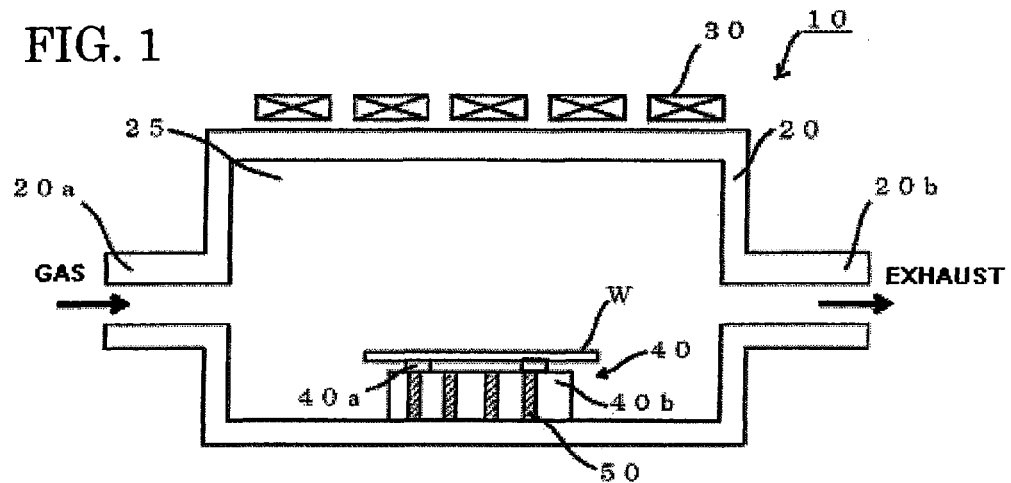
FIG. 1 is a schematic cross-sectional view illustrating one example of an RTP apparatus employed in a manufacturing method for a silicon wafer according to the invention.

FIG. 1 is a schematic cross-sectional view illustrating an example of an RTP (Rapid Thermal Process) apparatus to be used in the manufacturing method for a silicon wafer of the invention.

An RTP apparatus 10 to be used for the manufacturing method for a silicon wafer of the invention includes, as illustrated in FIG. 1, a reaction tube 20 having an atmospheric gas inlet 20a and an atmospheric gas outlet 20b, a plurality of lamps 30 disposed above the reaction tube 20 separately from each other, and a wafer support 40 for supporting a wafer W in a reaction space 25 in the reaction tube 20. The wafer support 40 has a ring-shaped susceptor 40a for directly supporting the wafer W and a stage 40b for supporting the susceptor 40a. The reaction tube 20 is made of, for example, quartz. The lamp 30 is, for example, a halogen lamp. The susceptor 40a is made of, for example, silicon. The stage 40b is made of, for example, quartz.

When the wafer W is subjected to a rapid heating/cooling thermal process (RTP: Rapid Thermal Process) by using the RTP apparatus 10 illustrated in FIG. 1, the wafer W is put into the reaction space 25 from an unillustrated wafer inlet of the reaction tube 20, and placed on the susceptor 40a of the wafer support 40.

Then, an atmospheric gas which will be described later is introduced from the atmospheric gas inlet 20a and at the same time, the surface of the wafer W is exposed to the lamp 30.

A temperature control in the reaction space 25 of the RTP apparatus 10 is effected by determining an average of temperatures at multiple points (for example, nine points) in the radial direction of the lower portion of the wafer W by using a plurality of radiation thermometers embedded in the stage 40b of the wafer support 40 and controlling (ON-OFF control of respective lamps or control of emission intensity of light) the plurality of halogen lamps 30 based on the temperature thus determined.

First Embodiment

The manufacturing method for a silicon wafer according to a first embodiment of the invention will hereinafter be described referring to accompanying drawings.

The manufacturing method for a silicon wafer according to the first embodiment of the invention includes subjecting a silicon wafer produced from a silicon single crystal ingot grown by the Czochralski process to a rapid heating/cooling thermal process under particular production conditions.

Growing of the silicon single crystal ingot by the Czochralski process is performed in a known manner.

Described specifically, the silicon single crystal ingot is produced by heating polycrystalline silicon filled in a quartz crucible into a silicon melt, bringing a seed crystal into contact with the silicon melt from above the liquid surface thereof, pulling up the resulting seed crystal while rotating the crystal and the quartz crucible, and extending it to a predetermined diameter to form a straight cylindrical portion.

The silicon single crystal ingot thus obtained is then processed into a silicon wafer in a known manner.

Described specifically, the silicon wafer is produced by slicing the silicon single crystal ingot into plural wafers by using an inner diameter blade or wire saw, and performing various processing steps such as chamfering of peripheral portions of the ingot, lapping, etching, and polishing. The processing steps described above are only exemplary and the invention is not limited only to these processing steps.

The silicon wafer thus obtained is then subjected to a rapid heating/cooling thermal process under predetermined production conditions.

Figure 2:
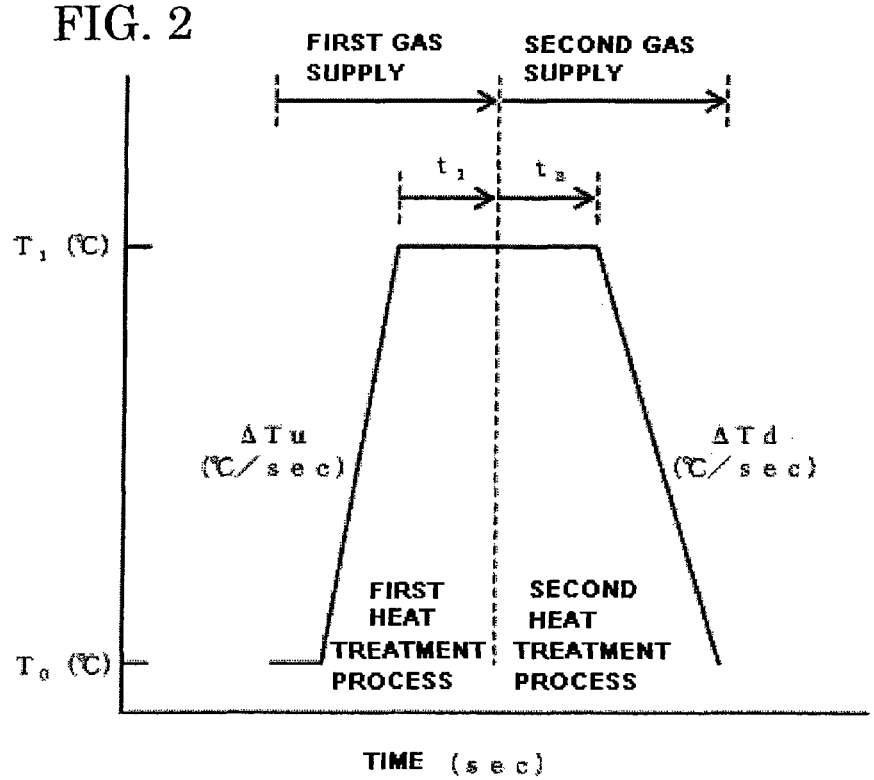
FIG. 2 is a schematic view illustrating production conditions in rapid heating/cooling thermal process to be applied to the manufacturing method for a silicon wafer according to a first embodiment of the invention.

FIG. 2 is a schematic diagram for illustrating production conditions in a rapid heating/cooling thermal process to be applied to the manufacturing method for a silicon wafer according to the first embodiment of the invention.

The rapid heating/cooling thermal process to be applied to the manufacturing method for a silicon wafer according to the first embodiment of the invention has a first and second heat treatment processes.

The first heat treatment process is performed while introducing a first gas. In the first heat treatment process, the silicon wafer prepared as described above is placed in the reaction tube 20 of the RTP apparatus 10 as illustrated in FIG. 1 at a desired temperature $T_0$ (for example, 500° C.), the silicon wafer is rapidly heated to a first temperature $T_1$ at a first heating rate $\Delta Tu$, and the silicon wafer is kept at the first temperature $T_1$ for a certain time period $t_1$.

After the first heat treatment process, the second heat treatment process is performed while stopping introducing the first gas and instead, introducing a second gas. In the second heat treatment process, the silicon wafer is kept at the first temperature $T_1$ for a certain time period $T_2$, and then the silicon wafer is rapidly cooled from the first temperature $T_1$ at a first cooling rate $\Delta Td$.

In the first heat treatment process, it is preferable that the first gas includes an oxygen gas in an amount of 0.01 vol. % or more and 1.00 vol. % or less and a rare gas. The term "the first gas includes an oxygen gas in an amount of 0.01 vol. %" as used herein means, when explaining by referring to FIG. 1, an oxygen concentration in the first gas supplied into the reaction tube 20 is 0.01 vol. %.

If using a nitrogen gas other than the rare gas as the first gas, because a nitride film is inevitably formed on the surface of the silicon wafer after the rapid heating/cooling thermal process, it is not preferred. Further, if using a hydrogen gas other than the rare gas as the first gas, it is also not preferred because there is a possibility of explosion as a result of mixing with an oxygen gas contained in the second gas at the time of switching the first and second gases which will be described later.

An Ar (argon) gas is preferred as the rare gas.

When the concentration of an oxygen gas in the first gas is less than 0.01 vol. %, surface roughness of the resulting silicon wafer cannot be alleviated, though the grown-in defect during the rapid heating/cooling thermal process can be reduced.

When the concentration of an oxygen gas in the first gas exceeds 1.00 vol. %, the surface roughness of the silicon wafer can be alleviated, but the grown-in defect in the rapid heating/cooling thermal process cannot be reduced.

The first heating rate $\Delta Tu$ is preferably 10° C./sec or more and 150° C./sec or less.

If the first heating rate $\Delta Tu$ is less than 10° C./sec, the productivity is deteriorated. If the first heating rate $\Delta Tu$ exceeds 150° C./sec, slip in the silicon wafer is occurred because the silicon wafer cannot bear a drastic temperature change.

The first temperature $T_1$ is preferably 1300° C. or higher and the melting point of silicon or lower. The term "first temperature $T_1$" as used herein means an average of temperatures at multiple points (nine points in this embodiment) in the radial direction of the lower portion of the wafer W when the wafer W is placed in the RTP apparatus 10 as illustrated in FIG. 1.

If the first temperature $T_1$ is less than 1300° C., the grown-in defect reduction capacity in the rapid heating/cooling thermal process cannot be improved.

The time $t_1$ for keeping the first temperature $T_1$ is preferably 1 sec or longer and 60 sec or shorter. The time $t_1$ within this range can realize a rapid heating/cooling thermal process having high productivity.

In the second heat treatment process, it is preferable to contain an oxygen gas of which concentration is 20 vol. % or more and 100 vol. % or less in the second gas.

The oxygen gas concentration less than 20 vol. % cannot improve the grown-in defect reduction capacity in the rapid heating/cooling thermal process.

Switching from the introduction of the first gas to the introduction of the second gas is preferably performed at the first temperature $T_1$ from the standpoint of productivity.

In the second heat treatment process, the time $t_2$ for keeping the silicon wafer at the first temperature $T_1$ after the gas atmosphere is switched is preferably 1 sec or longer and 60 sec or shorter. This enables to realize a rapid heating/cooling thermal process having high productivity.

The first cooling rate $\Delta Td$ is preferably 10° C./sec or more and 150° C./sec or less.

If the first cooling rate $\Delta Td$ is less than 10° C./sec, the productivity is deteriorated. If the first cooling rate $\Delta Td$ exceeds 150° C./sec, on the other hand, the slip may be occurred in the silicon wafer because the silicon wafer cannot bear the drastic temperature change.

Next, an LSTD (Laser Scattering Topography Defect) density reduction mechanism in the invention will be considered. FIG. 3 is a schematic view for illustrating the LSTD density reduction mechanism in the invention.

Figure 3A:
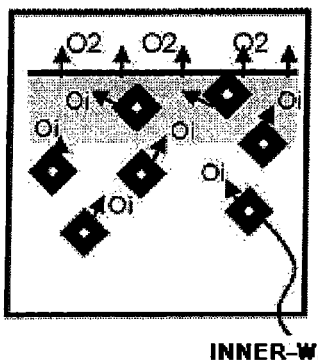
FIGS. 3A to 3C are schematic views illustrating LSTD density reduction mechanism according to the first embodiment.

When as described in the present embodiment, the rapid heating/cooling thermal process is performed under the introduction of the first gas including an oxygen gas in an amount of 0.01 vol. % or more and 1.00 vol. % or less and a rare gas in the first heat treatment process, a thin surface oxide film, which is thick enough to prevent to making rough the surface roughness, is formed on the surface of the silicon wafer. In high temperature treatment at 1300° C. or higher and the melting point of silicon or lower, oxygen contained in an inner-wall oxide film formed on the inner wall of COP (Crystal Original Particles) dissolves in the silicon wafer (FIG. 3A).

Figure 3B:
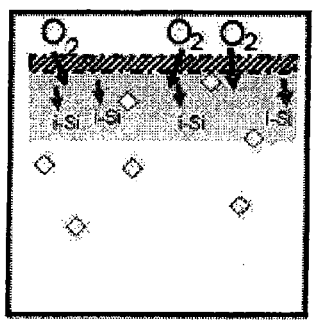

Under such a state, the introduction gas is switched to a second gas containing an oxygen gas in an amount of 20 vol. % or more and 100 vol. % or less in the second heat treatment process, whereby an oxygen solid solution is formed rapidly in the silicon wafer and further, Interstitial-Si (which will hereinafter be called "i-Si") is introduced (FIG. 3B). The resulting i-Si is filled in the COP which has been deprived of the inner-wall oxide film, leading to disappearance of the COP and formation of a so-called DZ (Denuded Zone) layer (FIG. 3C).

The manufacturing method for a silicon wafer according to the present embodiment can therefore improve a grown-in defect reduction capacity while suppressing generation of slip during the rapid heating/cooling thermal process and in addition, capable of alleviating surface roughness of the silicon wafer available by the rapid heating/cooling thermal process.

Figure 3C:
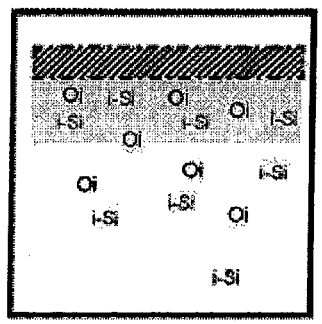

In the DZ layer thus formed, the oxygen solid solution (Oi) remains (FIG. 3C). A solid oxygen concentration in the DZ layer therefore becomes high in a device forming process which will be conducted layer so that dislocations generated in a device active region or generated from the backside of the wafer due to stress are pinned by the oxygen solid solution and extension of dislocations can be suppressed.

In addition, the DZ layer is oversaturated with interstitial silicon due to introduction of i-Si (interstitial Si) so that reprecipitation of an oxygen solid solution in the DZ layer, which will otherwise occur in the heat treatment (for example, heat treatment in the device forming process) after the rapid heating/cooling thermal process, can be prevented.

Second Embodiment

The manufacturing method for a silicon wafer according to the second embodiment of the invention will next be described referring to some drawings.

The manufacturing method for a silicon wafer according to the present embodiment is similar to that according to the first embodiment except for the production conditions in the rapid heating/cooling thermal process. Description on the production process other than the production conditions is therefore omitted.

Figure 4:
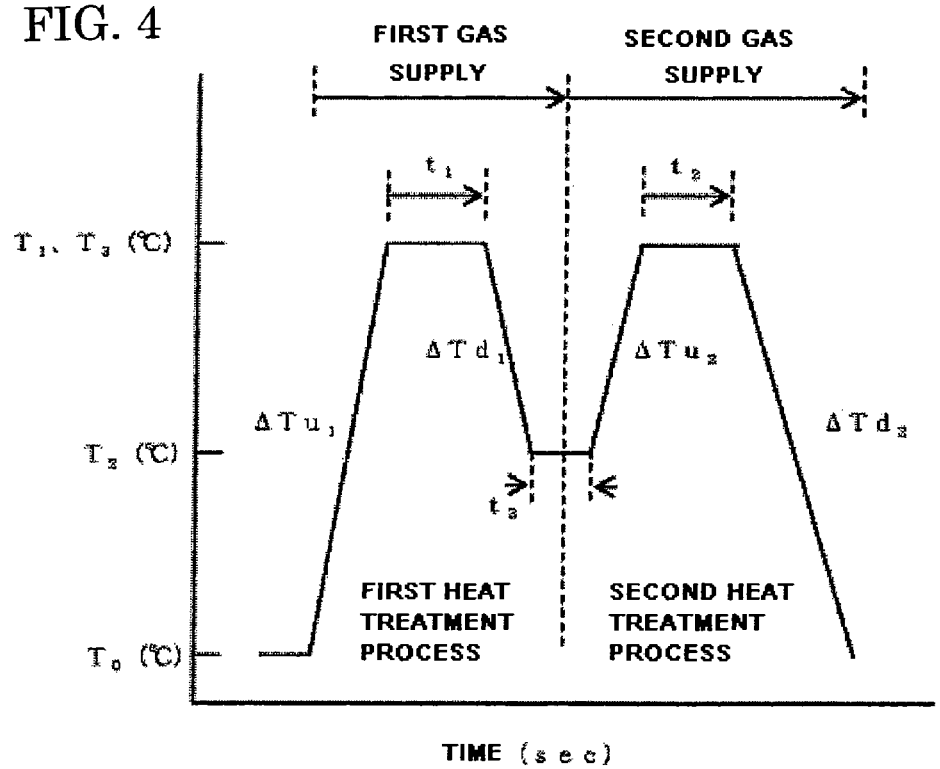
FIG. 4 is a schematic view illustrating production conditions in a rapid heating/cooling thermal process to be applied to a manufacturing method for a silicon wafer according to a second embodiment of the invention.

FIG. 4 is a schematic view for illustrating the production conditions in a rapid heating/cooling thermal process to be applied to the manufacturing method for a silicon wafer according to the second embodiment of the invention.

In the rapid heating/cooling thermal process according to the second embodiment of the invention, a first heat treatment process is performed while introducing a first gas, and a second heat treatment process is performed while stopping introducing the first gas and instead, introducing a second gas.

In the first heat treatment process, a silicon wafer produced in a similar manner to that employed in the first embodiment is placed in the reaction tube 20 of the RTP apparatus 10 as illustrated in FIG. 1 at a desired temperature $T_0$ (for example, 500° C.), the silicon wafer is rapidly heated to the first temperature $T_1$ at a first heating rate $\Delta Tu_1$, the silicon wafer is kept at the first temperature $T_1$ for a certain time period $t_1$, the silicon wafer is rapidly cooled at a first cooling rate $\Delta Td_1$ to a second temperature $T_2$, and the silicon wafer is kept at the second temperature $T_2$.

After performing the first heat treatment process, a second heat treatment process is performed. In the second heat treatment process, the silicon wafer is kept at the second temperature $T_2$, the silicon wafer is rapidly heated from the second temperature $T_2$ to a third temperature $T_3$ of 1300° C. or higher and the melting point of silicon or lower at a second heating rate $\Delta Tu_2$, the silicon wafer is kept at the third temperature $t_3$ for a predetermined time $t_2$, and the silicon wafer is rapidly cooled from the third temperature $T_3$ at a second cooling rate $\Delta Td_2$. The silicon wafer is kept at the second temperature $T_2$ for a certain time period $t_3$.

In the first heat treatment process, a rare gas is preferably used as the first gas.

As the first gas, a 100 vol. % rare gas is more preferred.

When the rapid heating/cooling thermal process to be used in the present embodiment is performed under the above described conditions, it is possible to alleviate surface roughness without damaging the grown-in defect reduction capacity.

As the rare gas, an Ar (argon) gas is preferably used.

The first heating rate $\Delta Tu_1$ is preferably 10° C./sec or more and 150° C./sec or less.

If the first heating rate $\Delta Tu_1$ is less than 10° C./sec, productivity becomes deteriorated. If the first heating rate $\Delta Tu_1$ exceeds 150° C./sec, on the other hand, the silicon wafer cannot bear a drastic temperature change, leading to a problem of generation of slip in the wafer.

The first temperature $T_1$ is preferably 1300° C. or higher and the melting point of silicon or lower. The term "first temperature $T_1$" as used herein means an average of temperatures at multiple points (nine points in the present embodiment) in the radial direction of the lower portion of the wafer W when the wafer W is disposed in the RTP apparatus 10 as illustrated in FIG. 1.

If the first temperature $T_1$ is lower than 1300° C., the grown-in defect reduction capacity in the rapid heating/cooling thermal process cannot be improved.

The time $t_1$ for keeping the silicon wafer at the first temperature is preferably 1 sec or longer and 60 sec or shorter. This enables to realize the rapid heating/cooling thermal process having high productivity.

The first cooling rate $\Delta Td_1$ is preferably 20° C./sec or more and 150° C./sec or less.

If the first cooling rate $\Delta Td_1$ is less than 20° C./sec, the grown-in defect reduction capacity in the rapid heating/cooling thermal process cannot be improved. When the first cooling rate $\Delta Td_1$ exceeds 150° C./sec, on the other hand, the silicon wafer cannot bear a drastic temperature change and slip may sometimes occur therein.

The second temperature $T_2$ is preferably 800° C. or higher and 1000° C. or lower.

If the second temperature $T_2$ is less than 800° C., an oxygen solid solution may be precipitated. If the second temperature $T_2$ exceeds 1000° C., surface may become rough.

In the second heat treatment process, it is preferable to use a gas including an oxygen gas in an amount of 20 vol. % or more and 100 vol. % or less as the second gas.

If the second gas having an oxygen gas of which concentration is less than 20 vol. %, the grown-in defect reduction capacity in the rapid heating/cooling thermal process cannot be improved.

The switching from the introduction of the first gas to the introduction of the second gas is preferably conducted at the second temperature $T_2$. If switching the introduction of the gases is carried out outside the range of the second temperature $T_2$ (less than 800° C. or higher than 1000° C.), it may cause inconveniences as described above. Thus, it is not preferable.

The retention time $t_3$ at the second temperature $T_2$ is preferably 1 sec or longer and 60 sec or shorter. The retention time within this range can realize a rapid heating/cooling thermal process having high productivity.

The second heating rate $\Delta Tu_2$ is preferably 20° C./sec or more and 150° C./sec or less.

If the second heating rate $\Delta Tu_2$ is less than 20° C./sec, the grown-in defect reduction capacity in the rapid heating/cooling thermal process cannot be improved. If the second heating rate $\Delta Tu_2$ exceeds 150° C./sec, on the other hand, the resulting silicon wafer cannot bear a drastic temperature change and slip may occur therein.

The retention time $t_2$ of the third temperature $T_3$ having a similar temperature range to that of the first temperature $T_1$ is also preferably 1 sec or longer and 60 sec or shorter. The retention time within the above-described range can achieve a rapid heating/cooling thermal process having high productivity.

The second cooling rate $\Delta Td_2$ is preferably 10° C./sec or more and 150° C./sec or less or less.

If the second cooling rate $\Delta Td_2$ is less than 10° C./sec, productivity may be deteriorated. When the second cooling rate $\Delta Td_2$ exceeds 150° C./sec, on the other hand, the silicon wafer cannot bear a drastic temperature change, which may lead to generation of slip therein.

Next, an LSTD density reduction mechanism in the present embodiment will be considered referring to FIGS. 3A to 3C as in the first embodiment.

When, in the first heat treatment process, the rapid heating/cooling thermal process is performed as described in the present embodiment, oxygen in the surface of the silicon wafer is diffused outwards and at the same time, oxygen contained in the inner-wall oxide film formed on the inner wall of a COP dissolves in the silicon wafer in the high-temperature treatment at 1300° C. or higher and the melting point of silicon or lower (FIG. 3A).

Under this state, by switching into the introduction of the gas containing an oxygen gas in an amount of 20 vol. % or more and 100 vol. % or less in the second heat treatment process, rapid dissolution of oxygen in the silicon wafer occurs and i-Si is introduced (FIG. 3B). The i-Si is filled in the COP which has been deprived of the inner-wall oxide film, whereby the COP disappears and a so-called DZ (Denuded Zone) layer is formed (FIG. 3C).

In the present embodiment, the introduction of the gas is switched into the oxygen-gas-containing gas at a temperature of 800° C. or higher and 1000° C. or lower so that the present embodiment is effective for preventing both the precipitation of an oxygen solid solution (Oi) in a region which will be the DZ layer and generation of surface roughness. It is therefore unnecessary to incorporate oxygen in an amount of 0.01 vol. % or more and 1.00 vol. % or less in the rare gas atmosphere in the first heat treatment process as described in the first embodiment. As described above, however, addition of oxygen to the rare gas atmosphere in an amount of 0.01 vol. % or more and 1.00 vol. % or less in the first heat treatment process is effective for preventing surface roughness further without deteriorating the grown-in defect reduction capacity.

In the DZ layer thus formed, the oxygen solid solution (Oi) remains (FIG. 3C). Since a concentration of the oxygen solid solution in the DZ layer is increased, in a device forming process which will be performed later, dislocations which have occurred in the device active region or have occurred due to a stress from the backside of the wafer are pinned by the oxygen solid solution, it is possible to suppress extension of the dislocations.

The manufacturing method for a silicon wafer according to the present embodiment can improve the grown-in defect reduction capacity while suppressing generation of slip during the rapid heating/cooling thermal process and at the same time, alleviate the surface roughness of the silicon wafer obtained by the rapid heating/cooling thermal process.

In addition, the DZ layer having i-Si (interstitial silicon) introduced therein is oversaturated with the interstitial silicon so that re-precipitation of the oxygen solid solution in the DZ layer which will otherwise occur by the heat treatment (for example, heat treatment in a device forming process) after the rapid heating/cooling thermal process can be prevented.

EXAMPLES

The advantages of the invention will hereinafter be described specifically by examples. It should however be borne in mind that the invention is not limited to or by the following examples.

Example 1

A silicon single crystal ingot having a P type, a crystal plane direction (001), a concentration of oxygen solid solution [Oi] of $1.2 \times 10^{18}$ atoms/cm$^3$ (calculated based on a conversion factor of Old ASTM standards in 1970-1979 Edition), and a resistance of from 23 to 25 Ω/cm was produced by CZ process.

At the time of production, nitrogen doping treatment was performed by putting a silicon wafer coated with a silicon nitride film in a crucible and a pull rate V was adjusted to 1.2 mm/min on average. At the same time, the pull rate and a temperature gradient G at 1300° C. in the direction of a crystal axis were controlled to control a V/G ratio in order to prevent generation of dislocation clusters during the growth of a silicon single crystal.

The resulting silicon single crystal ingot was then sliced into wafers by a wire saw and subjected to beveling, lapping, etching, and polishing to obtain a double-side polished silicon wafer having a diameter of 300 mm.

Then, the rapid heating/cooling thermal process of the silicon wafer thus prepared was performed using the RTP apparatus 10 as illustrated in FIG. 1. Production conditions in the rapid heating/cooling thermal process are as follows:

(1) Test 1 (Heat Treatment Sequence: FIG. 2)
First gas: an argon concentration of 99.99 vol. % and an oxygen concentration of 0.01 vol. %.
Second gas: an oxygen concentration of 100 vol. %.
$T_0$: 500° C.
$T_1$: under five conditions, that is, none, 1200° C., 1250° C., 1300° C., and 1350° C. (the term "none" means that rapid heating/cooling thermal process is not performed, which will equally apply hereinafter).
ΔTu: 75° C./sec.
ΔTd: 25° C./sec.
$t_1$: 10 sec.
$t_2$: 10 sec.

(2) Test 2 (Heat Treatment Sequence: FIG. 2)
First gas: an argon concentration of 99.99 vol. % and an oxygen concentration of 0.01 vol. %.
Second gas: an argon concentration of 80 vol. % and an oxygen concentration of 20 vol. %.
The other conditions are the same as those in Test 1.

(3) Test 3 (Heat Treatment Sequence: FIG. 2)
First gas: an argon concentration of 99.99 vol. % and an oxygen concentration of 0.01 vol. %.
Second gas: an argon concentration of 90 vol. % and an oxygen concentration of 10 vol. %.
The other conditions are the same as those in Test 1.

(4) Test 4 (Heat Treatment Sequence: Switching of a Gas Atmosphere in FIG. 2 is not Performed)
First and second gases: an oxygen concentration of 100 vol. %.
The other conditions are the same as those in Test 1.

(5) Test 5 (Heat Treatment Sequence: Switching of Introduction of the Gas in FIG. 2 is not Performed)
First and second gases: an argon concentration of 80 vol. % and an oxygen concentration of 20 vol. %.
The other conditions are the same as those in Test 1.

(6) Test 6 (Heat Treatment Sequence: Switching of the Introduction of the Gas in FIG. 2 is not Performed)
First and second gases: an argon concentration of 100 vol. %.
The other conditions are the same as those in Test 1.

Next, the LSTD density of the silicon wafers subjected to the rapid heating/cooling thermal process were measured. It was measured using "MO601" (trade name; product of Raytex Corporation) and adjusting the laser wavelength to 680 nm and approach depth to 5 μm.

Figure 5:
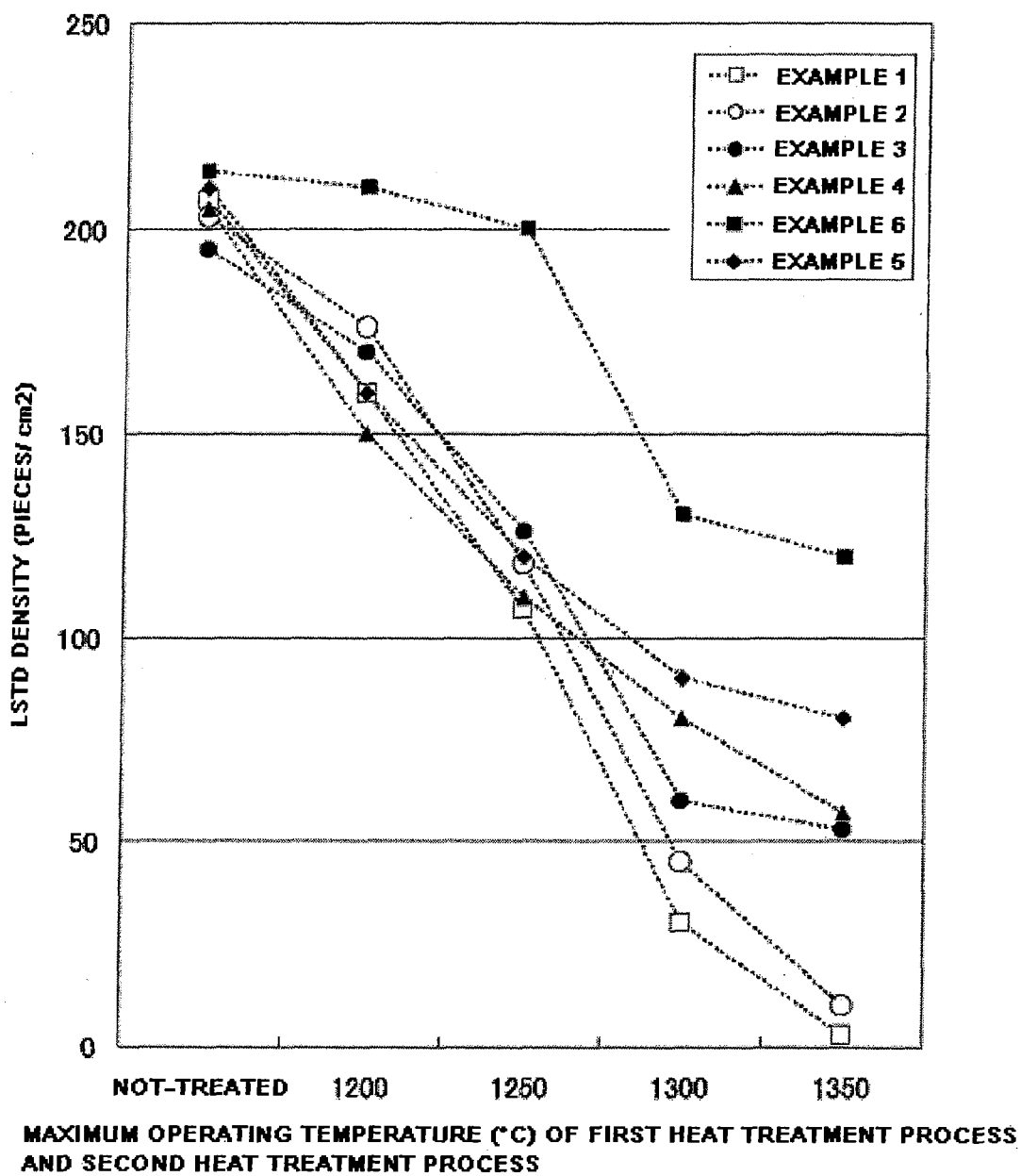
FIG. 5 illustrates measurement results, under varied conditions, of an LSTD density of a silicon wafer after a rapid heating/cooling thermal process in Example 1.

FIG. 5 illustrates measurement results, under varied conditions, of an LSTD density of the silicon wafer after the rapid heating/cooling thermal process in Example 1.

In FIG. 5, the maximum operating temperature $T_1$ (° C.) of the first heat treatment process and the second heat treatment process is plotted on the abscissa, while an LSTD density (pieces/cm$^2$) is plotted on the ordinate.

In FIG. 5, points indicated by a blank square, a blank circle, a solid circle, a solid triangle, a solid rhombus, and a solid square are plot data representing an LSTD density (pieces/cm$^2$) of Test 1, Test 2, Test 3, Test 4, Test 5, and Test 6, respectively, relative to the maximum operating temperature $T_1$ (° C.).

It has been confirmed from FIG. 5 that in Tests 1 and 2 when the second gas has an oxygen concentration of 20 vol. % or more, an LSTD density reduction effect is high. This is presumed to occur because with an increase in the oxygen concentration during the second heat treatment process, an oxidation amount of Si increases and a large amount of i-Si is injected into the wafer. At the maximum operating temperature $T_1$ not greater than 1250° C., no significant difference in the reduction of an LSTD density has been confirmed. This is presumed to occur because the inner-wall oxide film is not removed sufficiently from the COP in the first heat treatment process so that even a large amount of i-Si injected into the wafer does not enter the COP.

As shown in Test 6, even when $T_1$ is 1300° C. or higher, an LSTD density reduction effect is small. The inner-wall oxide film is expected to be removed from the COP at $T_1$ of 1300° C. or higher, but because of an atmospheric gas having 100 vol. % of argon, an injection amount of i-Si is presumed to be insufficient.

In Test 4, the gas atmosphere in the second heat treatment process has 100 vol. % of oxygen, but an LSTD density reduction effect is small. This is presumed to occur because the COP in the surface layer portion of the wafer can be removed in the presence of much oxygen, but the treatment which has started in the atmosphere having 100 vol. % of oxygen increases an oxygen solid solution concentration in the very surface layer portion of the wafer and the inner-wall oxide film of the COP in the portion is not removed sufficiently so that the COP remains in the very surface layer portion of the wafer.

In Test 5, the second gas has 80 vol. % of argon and 20 vol. % of oxygen. Thus, reduction in LSTD density is insufficient.

In the invention, therefore, the grown-in defect reduction capacity can be improved by carrying out a rapid heating/cooling thermal process at the maximum operating temperature of 1300° C. or higher by introducing a gas having 100 vol. % of argon in the first heat treatment process and then carrying out a rapid heating/cooling thermal process at the maximum operating temperature of 1300° C. or higher while switching the introduction of a gas having an oxygen concentration of 20 vol. % or more in the second heat treatment process.

Example 2

In a similar manner to Example 1, a double-side polished silicon wafer having a diameter of 300 mm was produced.

Then, a rapid heating/cooling thermal process of the silicon wafer thus produced was performed using the RTP apparatus 10 as illustrated in FIG. 1. The following are production conditions in the rapid heating/cooling thermal process.

(7) Test 7 (Heat Treatment Sequence: FIG. 2)
  First gas: Seven conditions, in total, with an argon concentration of 97.00 vol. %, 98.00 vol. %, 99.00 vol. %, 99.50 vol. %, 99.95 vol. %, 99.99 vol. %, and 100 vol. %. In addition, it contains, if any, an oxygen gas.
  Second gas: an oxygen concentration of 100 vol. %.
  $T_0$: 500° C.
  $T_1$: 1300° C.
  $\Delta Tu$: 75° C./sec.
  $\Delta Td$: 25° C./sec.
  $t_1$: 15 sec.
  $t_2$: 15 sec.

Next, the LSTD density and surface roughness of the silicon wafers subjected to the rapid heating/cooling thermal process were measured. The LSTD density was measured using "MO601" (trade name; product of Raytex Corporation) at a laser wavelength and approach depth adjusted to 680 nm and 5 μm, respectively. The surface roughness was measured using AFM (Atomic Force Microscopy) within a measurement range of 3 μm².

Figure 6:
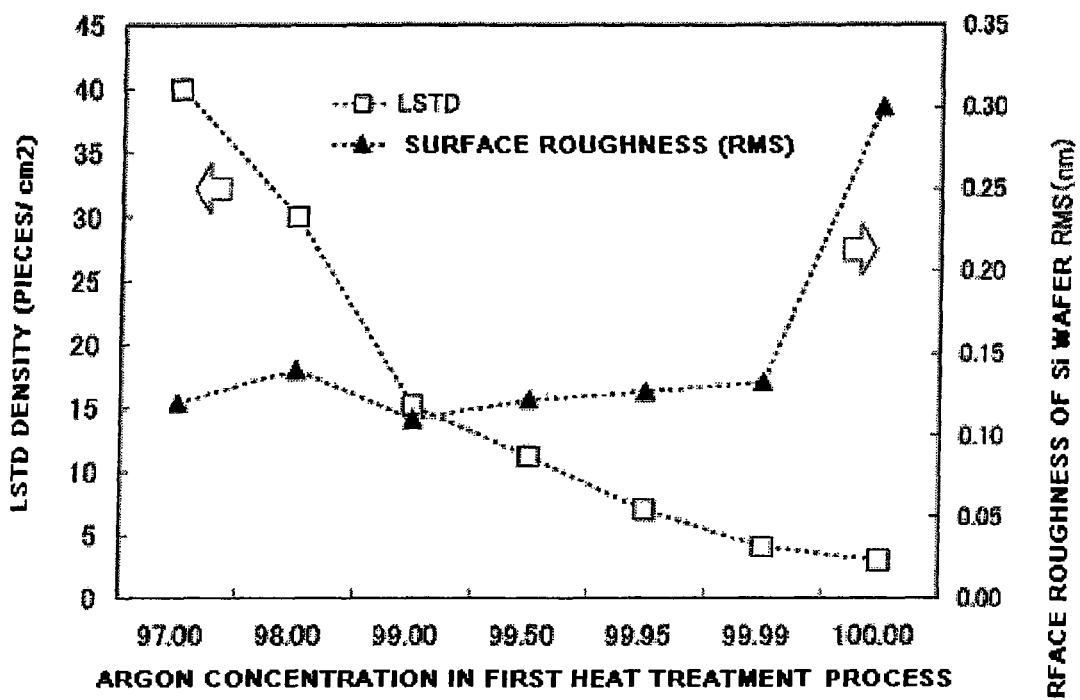
FIG. 6 illustrates measurement results, under varied conditions, of an LSTD density and micro-roughness of a silicon wafer after a rapid heating/cooling thermal process in Example 2.

FIG. 6 illustrates measurement results, under varied conditions, of an LSTD density and micro-roughness of the silicon wafer after the rapid heating/cooling thermal process in Example 2. In FIG. 6, an argon concentration (vol. %) in the first heat treatment process is plotted on the abscissa, an LSTD density (pieces/cm²) is plotted on the first ordinate (on the left side of paper), and surface roughness RMS (nm) is plotted on the second ordinate (on the right side of the paper).

As illustrated in FIG. 6, an LSTD density reduction effect is small at an argon concentration 98.00 vol. % or less (at an oxygen concentration of 2.00 vol. % or more). This is presumed to occur because an oxygen concentration in the very surface-layer portion of the wafer reaches a solid solution limit due to the presence of oxygen in the Ar atmosphere and an inner-wall oxide film of the COP in the very surface layer portion of the wafer cannot dissolve in Si crystals, making it difficult to remove the COP.

When the first gas has an argon concentration of 99.00 vol. % or more (an oxygen concentration of 1.00 vol. % or less), on the other hand, an LSTD density reduction effect is high. In the absence of oxygen (an argon concentration of 100 vol. %), the silicon wafer available after the rapid heating/cooling thermal process tends to have a rough surface. Such worsening of the surface roughness (RMS) is presumed to occur because the silicon wafer having no oxide film formed thereon in the first heat treatment process is exposed to an oxygen-containing gas atmosphere in the second heat treatment process and an oxide film is formed rapidly as a result of the oxidation of the surface.

It can therefore be confirmed that in the invention, an LSTD density reduction capacity can be improved and worsening of surface roughness can be prevented when an argon concentration is 99.00 vol. % or more and 99.99 vol. % or less, in other words, an oxygen concentration is 0.01 vol. % or more and 1.00 vol. % or less.

Example 3

In a similar manner to Example 1, a double-side polished silicon wafer having a diameter of 300 mm was prepared.

Then, by using the RTP apparatus 10 as illustrated in FIG. 1, the silicon wafer thus prepared was subjected to rapid heating/cooling thermal process. Production conditions in the rapid heating/cooling thermal process are as follows.

(8) Test 8 (Heat Treatment Sequence: FIG. 4)
  First gas: an argon concentration of 100 vol. %.
  Second gas: an oxygen concentration of 100 vol. %.
  $T_0$: 500° C.
  $T_1$: 1300° C.
  $T_2$: 800° C.
  $\Delta Tu_1$: 75° C./sec.
  $\Delta Td_1$: 15 conditions in total within a range of from 10 to 170° C./sec.
  $\Delta Tu_2$: 25° C./sec.
  $\Delta Td_2$: 25° C./sec.
  $t_1$: 15 sec.
  $t_2$: 15 sec.
  $t_3$: 15 sec.

A total slip length of the silicon wafer subjected to the rapid heating/cooling thermal process was evaluated. The entire wafer was measured using X-ray topography (XRT 300, 004 diffraction) manufactured by Rigaku Corporation. Each length of a plurality of slips observed across the entire wafer was measured and sum of the lengths of all the slips was evaluated as the total slip length.

Figure 7:
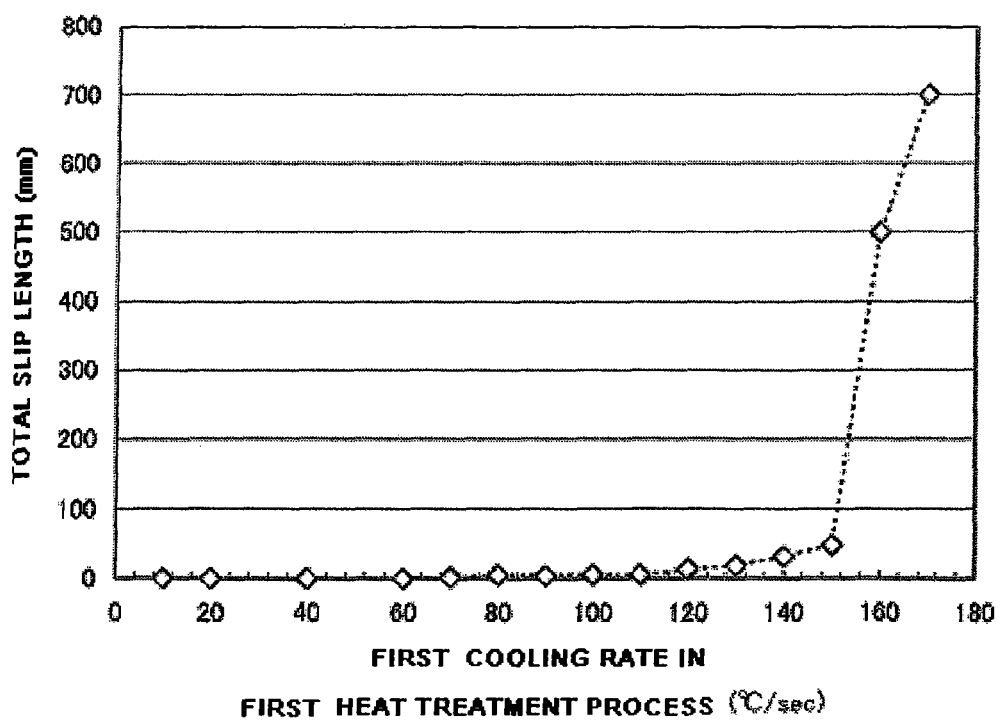
FIG. 7 illustrates measurement results, under varied conditions, of a total slip length of a silicon wafer after a rapid heating/cooling thermal process in Example 3.

FIG. 7 illustrates measurement results, under varied conditions, of the total slip length of the silicon wafer of after the rapid heating/cooling thermal process in Example 3.

It has been confirmed from FIG. 7 that a total slip length shows a drastic increasing tendency when the first cooling rate $\Delta Td_1$ in the first heat treatment process exceeds 150° C./sec.

It has also been confirmed that when the first cooling rate $\Delta Td_1$ is less than 20° C./sec, an LSTD density reduction effect is small. This is presumed to occur because due to a low first cooling rate $\Delta Td_1$, oxygen in the silicon crystals gathers on the inner wall of the COP again and forms an inner-wall oxide film so that the COP does not easily disappear even by the injection of i-Si in the second heat treatment process.

It has therefore been confirmed that in the invention, the first cooling rate $\Delta Td_1$ highly effective for reducing an LSTD density and preventing generation of slip in the first heat treatment process is 20° C./sec or more and 150° C./sec or less. The upper limit (150° C./sec or less) of the above-described result can also be applied similarly to the second cooling rate $\Delta Td_2$ in the second heat treatment process.

Example 4

In a similar manner to Example 1, a double-side polished silicon wafer having a diameter of 300 mm was prepared.

Then, using an RTP apparatus 10 as illustrated in FIG. 1, the silicon wafer thus prepared was subjected to a rapid heating/cooling thermal process. Production conditions in the rapid heating/cooling thermal process are as follows.

(9) Test 9 (Heat Treatment Sequence: FIG. 4)
First gas: an argon concentration of 100 vol. %.
Second gas: an oxygen concentration of 100 vol. %.
$T_0$: 500° C.
$T_1$: 1300° C.
$T_2$: 800° C.
$\Delta Tu_1$: 75° C./sec.
$\Delta Td_1$: 25° C./sec
$\Delta Tu_2$: 15 conditions in total within a range of from 10 to 170° C./sec.
$\Delta Td_2$: 25° C./sec
$t_1$: 15 sec.
$t_2$: 15 sec.
$t_3$: 15 sec.

A total slip length of the silicon wafer subjected to the rapid heating/cooling thermal process was evaluated. The entire wafer was measured using X-ray topography (XRT 300, 004 diffraction) manufactured by Rigaku Corporation. Each length of a plurality of slips observed across the entire wafer was measured and sum of the lengths of all the slips was evaluated as a total slip length.

Figure 8:
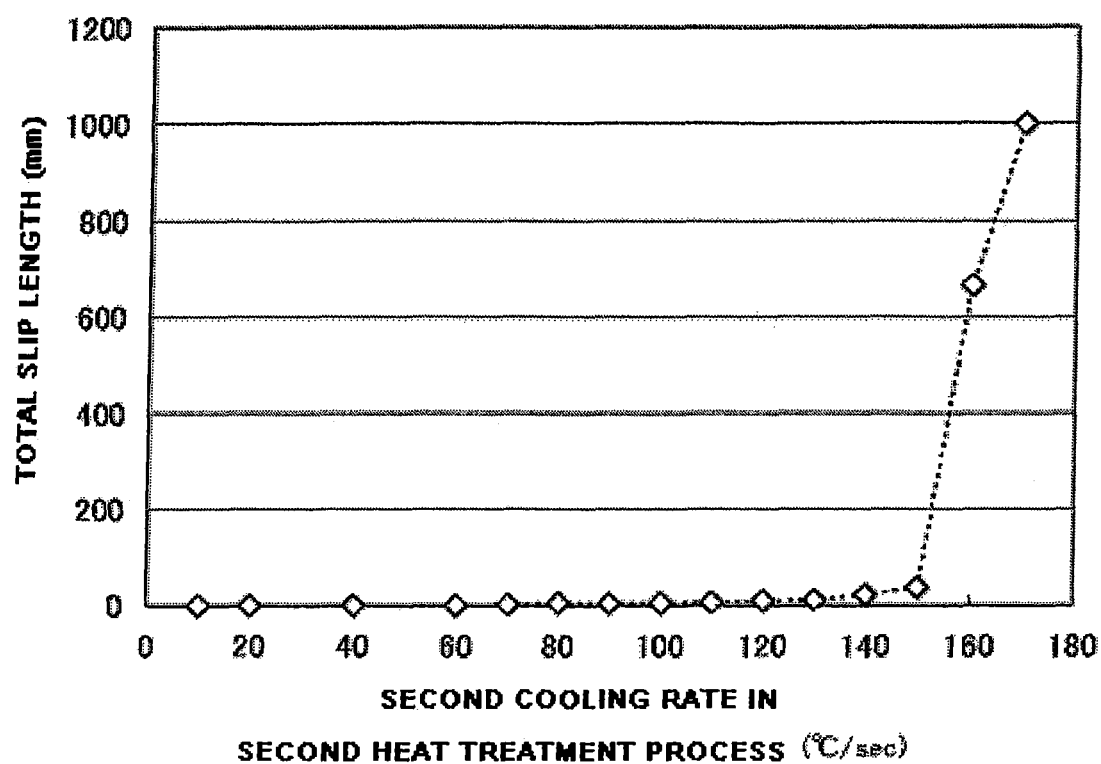
FIG. 8 illustrates measurement results, under varied conditions, of a total slip length of a silicon wafer after a rapid heating/cooling thermal process in Example 4.

FIG. 8 illustrates measurement results, under varied conditions, of the total slip length of the silicon wafer after the rapid heating/cooling thermal process in Example 4.

It has been confirmed from FIG. 8 that the total slip length shows a drastic increasing tendency when the second heating rate $\Delta Tu_2$ in the second heat treatment process exceeds 150° C./sec.

It has also been confirmed that an LSTD density reduction effect is low when the second heating rate $\Delta Tu_2$ is less than 20° C./sec. This is presumed to occur because due to a low second cooling rate $\Delta Tu_2$, oxygen in the Si crystals gathers on the inner wall of the COP again and forms an inner-wall oxide film so that the COP cannot easily disappear even by the injection of i-Si in the second heat treatment process.

It can therefore be confirmed that in the invention, the second heating rate $\Delta Tu_2$ highly effective for reducing an LSTD density and preventing generation of slip in the second heat treatment process is 20° C./sec or more and 150° C./sec or less. The upper limit (150° C./sec or less) of the above-described result can also be applied similarly to the first heating rate $\Delta Tu_1$ in the first heat treatment process.

While the invention has been described in connection with the exemplary embodiments, it will be obvious to those skilled in the art that various changes and modifications may be made therein without departing from the present invention, and it is aimed, therefore, to cover in the appended claim all such changes and modifications as fall within the true spirit and scope of the present invention.

This application claims priority from Japanese Patent Application 2008-198682, filed Jul. 31, 2008, which is incorporated herein by reference in its entirety.

What is claimed is:

1. A manufacturing method for a silicon wafer comprising:
    producing a silicon single crystal ingot grown by Czochralski process;
    slicing the silicon single crystal ingot into plural silicon wafers;
    performing a first heat treatment process on the silicon wafer while introducing a first gas having an oxygen gas in an amount of 0.01 vol. % or more and 1.00 vol. % or less and a rare gas, the first heat treatment process comprising:
        rapidly heating the silicon wafer to a first temperature of 1300° C. or higher and a melting point of silicon or lower at a first heating rate; and
        keeping the silicon wafer at the first temperature; and
    after the first heat treatment process, performing a second heat treatment process on the silicon wafer while stopping introducing the first gas and instead, introducing a second gas having an oxygen gas in an amount of 20 vol. % or more and 100 vol. % or less and a rare gas, the second heat treatment process comprising:
        keeping the silicon wafer at the first temperature; and
        rapidly cooling the silicon wafer from the first temperature at a first cooling rate.

2. The manufacturing method for the silicon wafer according to claim 1, wherein
    the first heating rate is 10° C./sec or more and 150° C./sec or less and the first cooling rate is 10° C./sec or more and 150° C./sec or less.

3. A manufacturing method for a silicon wafer comprising:
    producing a silicon single crystal ingot grown by Czochralski process;
    slicing the silicon single crystal ingot into plural silicon wafers;
    performing a first heat treatment process on the silicon wafer while introducing a first gas including a rare gas, the first heat treatment comprising:
        rapidly heating the silicon wafer to a first temperature of 1300° C. or higher and the melting point of silicon or lower at a first heating rate;
        keeping the silicon wafer at the first temperature;
        rapidly cooling the silicon wafer to a second temperature of 800° C. or higher and 1000° C. or lower at a first cooling rate; and
        keeping the silicon wafer at the second temperature; and
    performing a second heat treatment process on the silicon wafer while stopping introducing the first gas and instead, introducing a second gas including an oxygen gas in an amount of 20 vol. % or more and 100 vol. % or less; the second heat treatment comprising:
        keeping the silicon wafer at second temperature;
        rapidly heating the silicon wafer from the second temperature to a third temperature of 1300° C. or higher and the melting point of silicon or lower at a second heating rate;
        keeping the silicon wafer at the third temperature; and
        rapidly cooling the silicon wafer from the third temperature at a second cooling rate.

4. The manufacturing method for a silicon wafer according to claim 3, wherein
    the first cooling rate is 20° C./sec or more and 150° C./sec or less and
    the second heating rate is 20° C./sec or more and 150° C./sec or less.

5. The manufacturing method for the silicon wafer according to claim 4, wherein
    the first heating rate is 10° C./sec or more and 150° C./sec or less and
    the second cooling rate is 10° C./sec or more and 150° C./sec or less.

* * * * *